United States Patent
Jeon et al.

(10) Patent No.: US 8,358,490 B2
(45) Date of Patent: Jan. 22, 2013

(54) TRANSISTOR WITH EOS PROTECTION AND ESD PROTECTION CIRCUIT INCLUDING THE SAME

(75) Inventors: Chan-Hee Jeon, Yongin-si (KR);
Kyoung-Sik Im, Yongin-si (KR);
Hyun-Jun Choi, Suwon-si (KR);
Han-Gu Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 812 days.

(21) Appl. No.: 12/213,231

(22) Filed: Jun. 17, 2008

(65) Prior Publication Data

US 2008/0310061 A1      Dec. 18, 2008

(30) Foreign Application Priority Data

Jun. 18, 2007 (KR) .................. 10-2007-0059362

(51) Int. Cl.
*H02H 9/00* (2006.01)
*H02H 3/20* (2006.01)
*H02H 9/04* (2006.01)
(52) U.S. Cl. .......................... 361/56; 361/91.1; 361/111
(58) Field of Classification Search .................. 361/56, 361/91.1, 111; 257/355–363, 366
See application file for complete search history.

(56) References Cited

U.S. PATENT DOCUMENTS

| 4,949,139 | A | 8/1990 | Korsh et al. |
| 6,002,156 | A * | 12/1999 | Lin ............................ 257/356 |
| 6,501,136 | B1 * | 12/2002 | Lin ............................ 257/355 |
| 6,835,623 | B2 * | 12/2004 | Shiau et al. .................. 438/286 |
| 7,102,862 | B1 * | 9/2006 | Lien et al. ...................... 361/56 |
| 2005/0180076 | A1 * | 8/2005 | Saito et al. .................. 361/91.1 |

FOREIGN PATENT DOCUMENTS

| KR | 1020040102190 | 12/2004 |
| KR | 1020060038248 | 5/2006 |

* cited by examiner

*Primary Examiner* — Rexford Barnie
*Assistant Examiner* — Christopher Clark
(74) *Attorney, Agent, or Firm* — Harness, Dickey & Pierce, P.L.C.

(57) ABSTRACT

A transistor with an electrical overstress (EOS) protection may include an active region, a plurality of impurity regions and a conduction pattern. The active region may be formed in a substrate. The impurity regions may be formed in the active region and arranged at a predetermined or given distance with respect to each other. The conduction pattern may be arranged between each of the impurity regions in a meandering shape, and the conduction pattern may include a center portion connected to a ground terminal. Therefore, a transistor with EOS protection, a clamp device, and an ESD protection circuit including the same may increase an on-time of a clamp device and may sufficiently discharge a charge due to the EOS by including a conduction pattern configured with gates that are connected with respect to each other in a meandering shape.

16 Claims, 5 Drawing Sheets

TRANSISTOR WITH EOS PROTECTION AND ESD PROTECTION CIRCUIT INCLUDING THE SAME

PRIORITY STATEMENT

This application claims priority under 35 USC §119 to Korean Patent Application No. 2007-0059362, filed on Jun. 18, 2007, in the Korean Intellectual Property Office (KIPO), the entire contents of which are incorporated herein by reference.

BACKGROUND

1. Field

Example embodiments relate to electrostatic discharge (ESD) protection, and more particularly, to a transistor with electrical overstress (EOS) protection, a clamp device including the transistor and an ESD protection circuit including the clamp device.

2. Description of the Related Art

Electrostatic discharge (ESD) is a phenomenon where a finite quantity of electrostatic charge may be rapidly transferred between bodies or surfaces at different electrostatic potentials. The duration of ESD events may range from picoseconds to microseconds. Electrical overstress (EOS) may be an electrical shock that occurs when a product is exposed to a leakage current or voltage usually from a power supply device or test equipment. The duration of EOS events may range from nanoseconds to milliseconds. As described above, ESD and EOS are different with regards to the duration of electrical transient pulse widths.

A thin insulating layer, e.g., a gate oxide layer, may be damaged, when an ESD event or EOS event occurs in a device manufactured by a complementary metal-oxide semiconductor (CMOS) process. Therefore, a protection circuit for ESD and EOS may be required. As a semiconductor technology advances, the degree of integration of semiconductor devices may increase and power consumption of semiconductor devices may decrease, and thus, the semiconductor devices may be more easily exposed to ESD. When the thickness of a gate oxide layer of a MOS transistor ranges from about 3 nm to about 4 nm, an insulating layer may be destroyed by a voltage ranging from about 3 V to about 4 V, and thus, there may be an increasing demand for a protection circuit protecting an internal core from an ESD event and EOS event. For meeting the demand, many protection technologies have been developed for protecting the internal core from an ESD event and EOS event.

FIG. 1 is a circuit diagram illustrating a conventional gate-grounded n-channel metal oxide semiconductor (GGNMOS) transistor. FIG. 2 is a circuit diagram illustrating a conventional gate-coupled NMOS (GCNMOS) transistor. The GGNMOS transistor of FIG. 1 has a configuration where a gate, a source, and a body may all be grounded, and uses a snap-back phenomenon. The GGNMOS transistor may be capable of protecting the internal core from an EOS event that has a relatively long duration of electrical transient pulse widths. However, the GGNMOS transistor may not be efficiently capable of protecting the internal core from an ESD event because an ESD current may flow into the internal core until triggering a voltage level of the transistor. The ESD current may be discharged through the transistor instead of flowing into the internal core at the triggering voltage level of the transistor.

A GCNMOS transistor having a configuration where a silicide blocking layer (SBL) is eliminated may be employed. The configuration of the GCNMOS may be capable of protecting the internal core from an ESD event that has a relatively short duration of electrical transient pulse widths. However, the GCNMOS may not be capable of protecting the internal core from an EOS event that has a relatively long duration of electrical transient pulse widths. When the GCNMOS of FIG. 2 is implemented with a bipolar insulated-gate field-effect transistor (BIGFET) manufactured in a relatively large size, and the EOS is applied to the BIGFET, a gate of the BIGFET may be in an off state and the BIGFET may be damaged due to a parasitic bipolar operation. Generally, a center portion of the BIGFET may be easily damaged. An on-time of the gate may be increased so as to prevent or reduce the damage. For example, a capacitance of a capacitor C or a resistance of a resistor R may be increased in FIG. 2. However, an additional space may be required so as to increase the capacitance C of the capacitor or the resistance of the resistor R.

SUMMARY

Accordingly, example embodiments are provided to substantially obviate one or more problems due to limitations and disadvantages of the related art. Example embodiments provide a transistor with EOS protection including a conduction pattern in a meandering shape. Example embodiments provide a clamp device including the transistor. Example embodiments provide an ESD protection circuit including the clamp device with EOS protection.

In example embodiments, a transistor with electrical overstress (EOS) protection may include an active region, a plurality of impurity regions and a conduction pattern. The active region may be formed in a substrate. The impurity regions may be formed in the active region and arranged at a given distance with respect to each other. The conduction pattern may be arranged between each of the impurity regions in a meandering shape, and the conduction pattern may include a center portion connected to a ground terminal.

The active region may include a first conduction type and each of the impurity regions may include a second conduction type opposite to the first conduction type. The first conduction type may correspond to a P type. A resistance of the conduction pattern may correspond to a minimum or reduced value at the center portion, and the resistance of the conduction pattern may increase according to a distance from the center portion to end sides of the conduction pattern. The transistor with EOS protection may further include a silicide blocking layer on the conduction pattern. The transistor may correspond to a relatively large BIGFET. According to example embodiments, a clamp device may include the transistor of example embodiments. According to example embodiments, an electrostatic discharge (ESD) protection circuit may include a stress detection circuit providing a clamping signal at a first node, the stress detection circuit being connected between a power voltage line and the first node, and the clamp device of example embodiments, wherein the clamp device is connected between the power voltage line and a ground voltage line.

In example embodiments, an electrostatic discharge (ESD) protection circuit may include a stress detection circuit and a clamp device. The stress detection circuit may provide a clamping signal at a first node, the stress detection circuit may be connected between a power voltage line and the first node, and the clamping signal may be activated when a positive ESD event or a positive electrical overstress (EOS) event occurs. The clamp device may include the transistor of example embodiments and may maintain the activation of the clamping signal until a first electric charge due to the positive ESD event or the positive EOS event is discharged, and the clamp device may be connected between the power voltage line and a ground voltage line.

The clamp device may discharge a second electric charge due to a negative ESD event or a negative EOS event to the ground voltage line when the negative ESD event or the negative EOS event occurs. The stress detection circuit may include a capacitor having a first terminal connected to the power voltage line and a second terminal connected to the first node. The clamp device may include a transistor, and the transistor may include an active region, a plurality of impurity regions and a conduction pattern. The active region may be formed in a substrate. The impurity regions may be formed in the active region and arranged at a predetermined or given distance with respect to each other. The conduction pattern may be arranged between the impurity regions in a meandering shape, and the conduction pattern may include a center portion connected to a ground terminal.

The active region may include a first conduction type and each of the impurity regions may include a second conduction type opposite to the first conduction type. The first conduction type may correspond to a P type. The impurity regions may include source regions and drain regions that may be arranged alternatively with respect to each other. Each of the source regions may be connected to the ground voltage line, and each of the drain regions may be connected to the power voltage line. Both end sides of the conduction pattern may be connected to the first node.

A resistance of the conduction pattern may correspond to a minimum or reduced value at the center portion, and the resistance of the conduction pattern may increase according to a distance from the center portion to end sides of the conduction pattern. The ESD protection circuit may further include a silicide blocking layer on the conduction pattern. The transistor may correspond to a relatively large BIGFET. Therefore, a transistor with EOS protection, a clamp device including the same and an ESD protection circuit including the same may increase an on-time of a clamp device and may sufficiently discharge a charge due to EOS by including a conduction pattern implemented with gates that are connected with respect to each other in a meandering shape.

BRIEF DESCRIPTION OF THE DRAWINGS

Example embodiments will be more clearly understood from the following detailed description taken in conjunction with the accompanying drawings.

FIGS. 1-2 are circuit diagrams illustrating a conventional gate-grounded n-channel metal oxide semiconductor (GGN-MOS) transistor, and a conventional gate-coupled NMOS (GCNMOS) transistor, respectively;

FIG. 3 is a plan view illustrating a transistor with an electrical overstress (EOS) protection according to example embodiments;

FIG. 4 is a cross-sectional view taken substantially along line I-I' of the transistor of FIG. 3;

FIG. 5 is a diagram illustrating a silicide blocking layer on the conduction pattern in FIG. 4;

FIG. 6 is a block diagram illustrating an electrostatic discharge (ESD) protection circuit according to example embodiments; and FIG. 7 is a circuit diagram illustrating the ESD protection circuit of FIG. 6.

Figure 1:
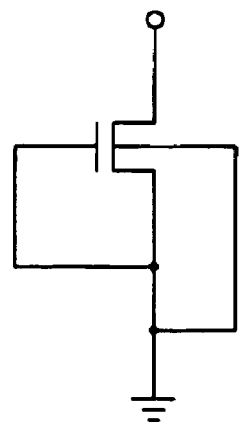
FIGS. 1-7 represent non-limiting, example embodiments as described herein.
Figure 2:
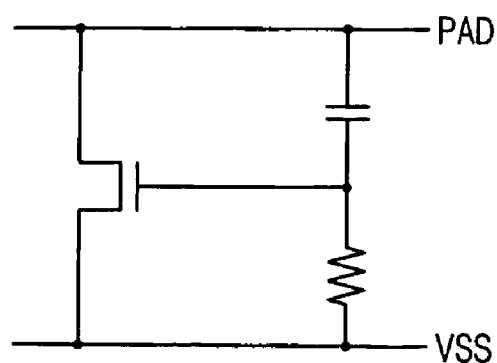

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments now will be described more fully with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 3:
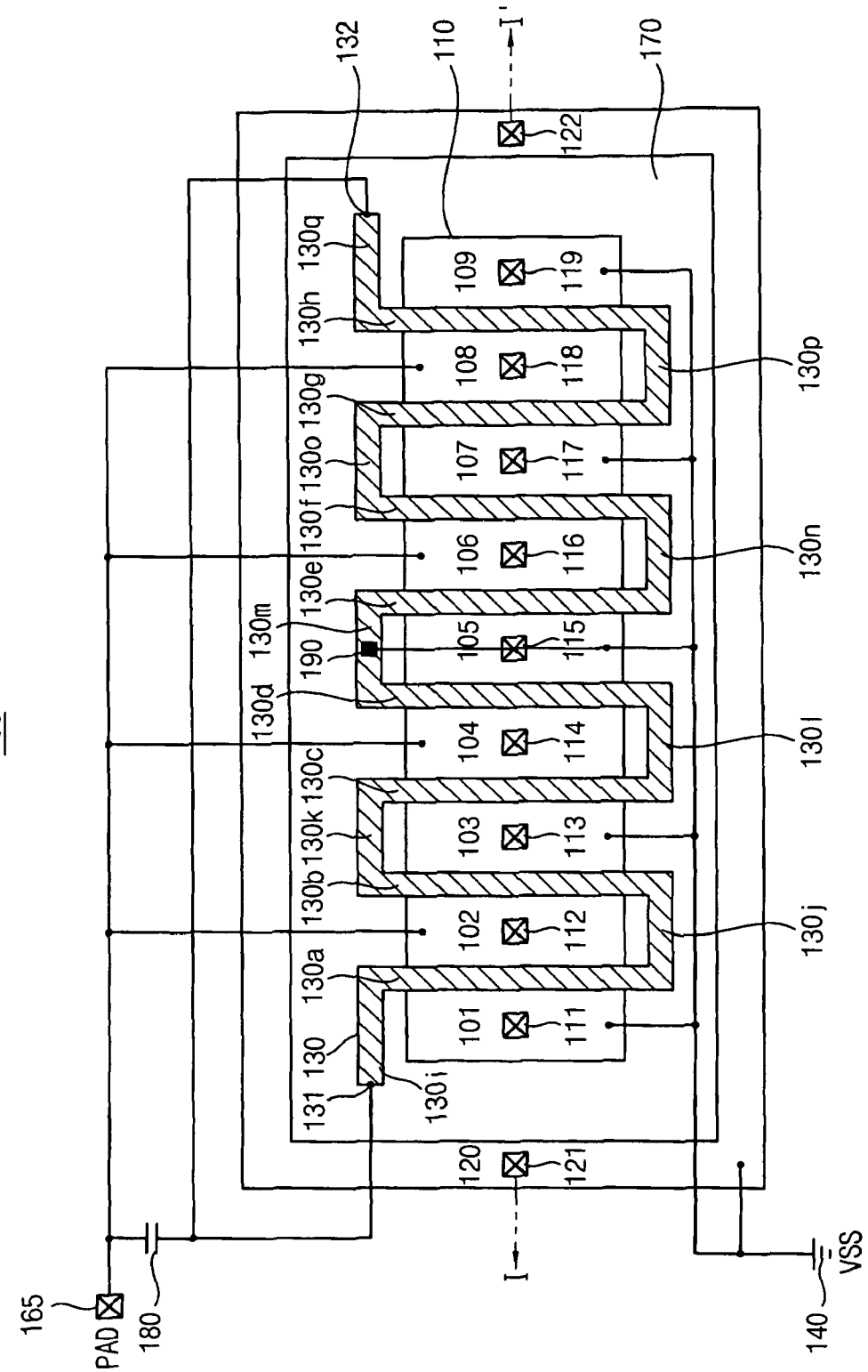
Figure 4:
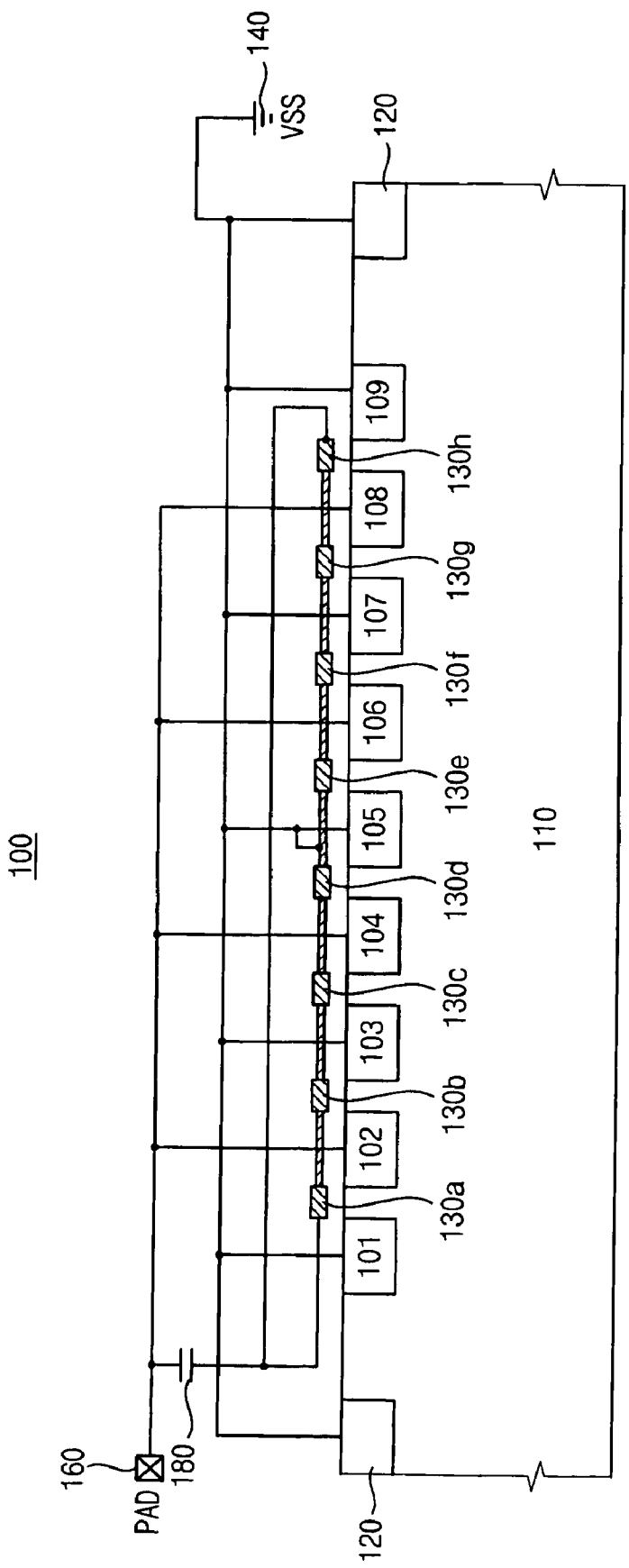

FIG. 3 is a plan view illustrating a transistor with an electrical overstress (EOS) protection according to example embodiments. FIG. 4 is a cross-sectional view taken substantially along line I-I' of the transistor of FIG. 3. Referring to FIGS. 3 and 4, a transistor 100 with EOS protection may include an active region 110, a plurality of impurity regions 101, 102, 103, 104, 105, 106, 107, 108 and 109 and a conduction pattern 130. The active region 110 may be formed in a semiconductor substrate. The impurity regions 101, 102, 103, 104, 105, 106, 107, 108 and 109 may be formed in the active region 110, and the impurity regions 101, 102, 103, 104, 105, 106, 107, 108 and 109 may be arranged at a predetermined or given distance with respect to each other. The conduction pattern 130 may be arranged between each of the impurity regions 101, 102, 103, 104, 105, 106, 107, 108 and 109 in a meandering shape. The conduction pattern 130 may include first regions 130a, 130b, 130c, 130d, 130e, 130f, 130g and 130h, which may be parallel with the impurity regions 101, 102, 103, 104, 105, 106, 107, 108 and 109 and second regions 130i, 130j, 130k, 130l, 130m, 130n, 130o, 130p and 130q, which may be perpendicular to the impurity regions 101, 102, 103, 104, 105, 106, 107, 108 and 109. A center portion 190 of the conduction pattern 130 may be connected to a ground terminal 140. Some impurity regions 101, 103, 105, 107 and 109 may be connected to the ground terminal 140 and used as source regions. Other impurity regions 102, 104, 106 and 108 may be connected to a pad 165 and used as drain regions. The conduction pattern 130 may be used as gates.

The transistor 100 may further include a pick-up region 120 and an isolation region 170 between the active region 110 and the pick-up region 120. At least one contact 111, 112, 113, 114, 115, 116, 117, 118, 119, 121 and 122 may be formed on each area of the pick-up region 120 and the impurity regions 101, 102, 103, 104, 105, 106, 107, 108 and 109. The active region 110 may be a first conduction type and each of the impurity regions 101, 102, 103, 104, 105, 106, 107, 108 and 109 may be a second conduction type. For example, an active region 110 may be a P type and each of the impurity regions 101, 102, 103, 104, 105, 106, 107, 108 and 109 may be an N type.

The center portion 190 of the conduction pattern 130 may be connected to the ground terminal 140, and both end sides 131 and 132 of the conduction pattern 130 may be connected to a first terminal of a capacitor 180. A second terminal of the capacitor 180 may be connected to a pad 165. The conduction pattern 130 may be formed with a metal. Therefore, a resistance of the conduction pattern 130 may be substantially zero at the center portion 190 and the resistance of the conduction pattern 130 may increase according to a distance from the center portion 190 to the end sides 131 and 132.

Figure 5:
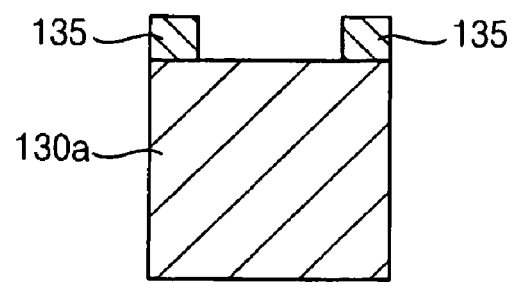

A length of the conduction pattern 130 may increase when the transistor 100 is a relatively wide BIGFET. Therefore, the resistance of the conduction pattern 130 may increase according to a distance from the center portion 190 to the end sides 131 and 132. Resistance of the conduction pattern 130 may be at its maximum or greatest at the first regions 130a and 130h, and resistance of the conduction pattern 130 may be at its minimum or lowest at the first regions 130d and 130e. The resistance of the conduction pattern 130 at the first regions 130d and 130e may be about zero. The transistor 100 may use the conduction pattern 130, for example, the gates, as a resistor. The transistor 100 may further include a silicide blocking layer 135 on the conduction pattern 130a so as to increase resistance as illustrated in FIG. 5.

Figure 6:
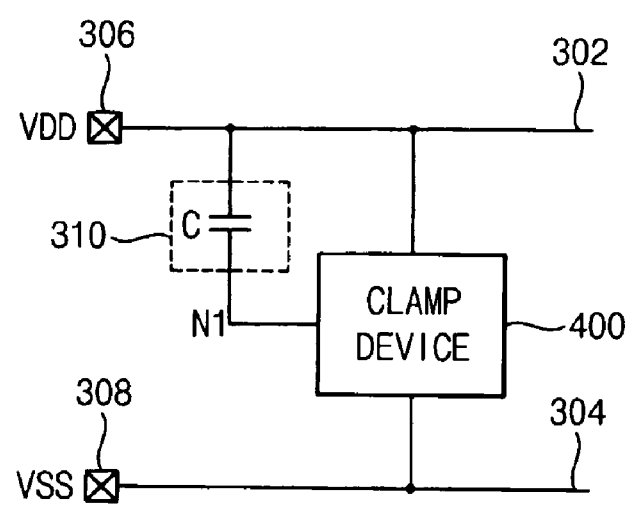

FIG. 6 is a block diagram illustrating an electrostatic discharge (ESD) protection circuit according to example embodiments. Referring to FIG. 6, an ESD protection circuit 300 may include a stress detection circuit 310 and a clamp device 400. The stress detection circuit 310 may be connected between a power voltage line 302 and a first node N1. The stress detection circuit 310 may be implemented with a capacitor C. The clamp device 400 may be connected between the power voltage line 302 and a ground voltage line 304, and the clamp device 400 may be connected to the first node N1 and the ground terminal 308.

Figure 7:
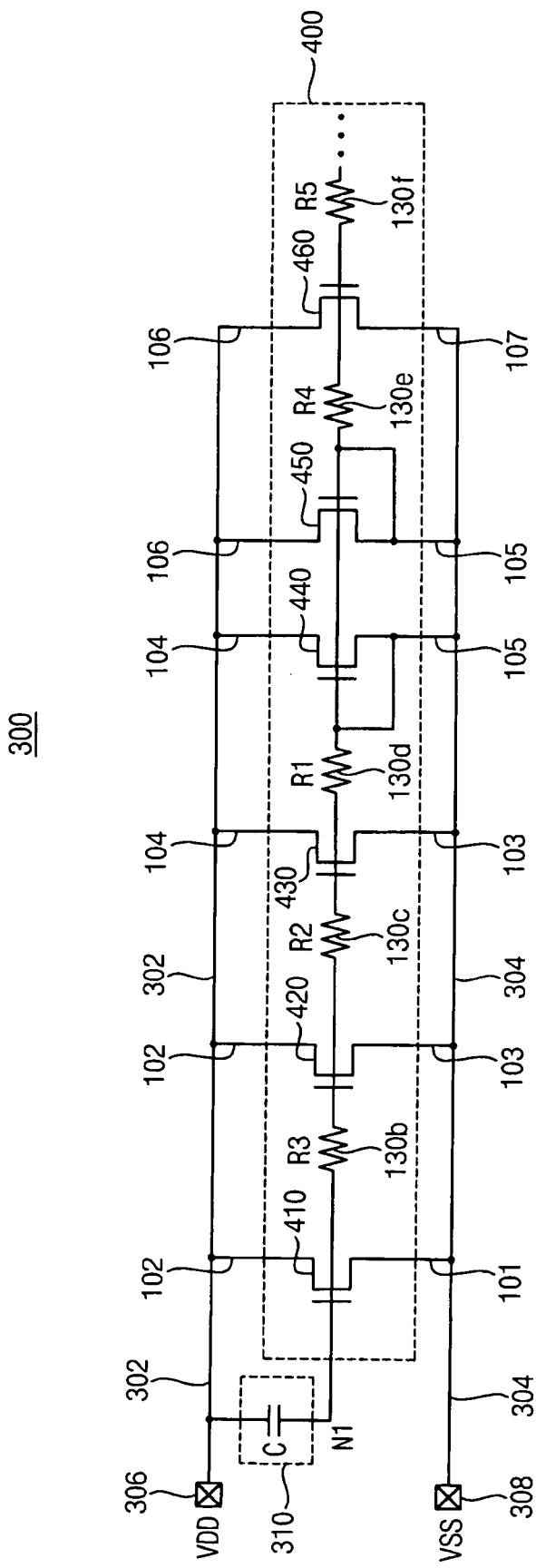

FIG. 7 is a circuit diagram illustrating the ESD protection circuit of FIG. 6. The clamp device of FIG. 6 may be implemented with the transistor 100 with the EOS protection of FIG. 3, and FIG. 7 is a simplified equivalent circuit diagram illustrating the transistor 100 with the EOS protection of FIG. 3. In FIG. 7, the impurity regions 101, 102, 103, 104, 105, 106 and 107 and the first regions 130b, 130c, 103d, 130e and 130f of the conduction pattern of the transistor 100 with EOS protection of FIG. 3 may be illustrated. Some impurity regions 101, 103, 105, and 107 may be connected to the ground terminal 308.

Referring to FIG. 7, the clamp device 400 may include n-channel metal oxide semiconductor (NMOS) transistors 410, 420, 430, 440, 450 and 460. The impurity regions 102, 104 and 106 illustrated in FIG. 3 may be drains of the NMOS transistors 410, 420, 430, 440, 450 and 460, and each of the drains 102, 104 and 106 may be connected to the power voltage line 302. The impurity regions 101, 103, 105 and 107 illustrated in FIG. 3 may be sources of the NMOS transistors 410, 420, 430, 440, 450 and 460, and each of the sources 101, 103, 105 and 107 may be connected to the ground voltage line 304. The first regions 130b, 130c, 103d, 130e and 130f of the conduction pattern may be gates of the NMOS transistors 410, 420, 430, 440, 450 and 460.

Each of the gates 130b, 130c, 103d, 130e and 130f may be connected to each other, and each of the connection points of the gates 130b, 130c, 103d, 130e and 130f may be illustrated as resistors R3, R2, R1, R4 and R5. A resistance relationship of the resistors R1, R2, R3, R4 and R5 may be expressed as R3>R2=R5>R1=R4. Each of the resistances of the resistors R1 and R4 may be about zero because each of the gates 130d and 130e of the NMOS transistor 440 may be connected to the ground voltage line 304. Resistance at the gate of the NMOS transistor 410 may correspond to R3+R2+R1 because the gate of the NMOS transistor 410 may be connected to the capacitor 310 and the first regions 130b, 130c and 130d of the conduction pattern may be connected in series. Therefore, resistance at the gate of the NMOS transistor 410 may be at its maximum or greatest in the ESD protection circuit 300.

Hereinafter, an operation of the ESD protection circuit 300 will be described in detail with reference to FIGS. 3, 4, 6 and 7. In FIGS. 6 and 7, the NMOS transistors 410, 420, 430, 440, 450 and 460 may operate as a forward-biased diode, and the NMOS transistors 410, 420, 430, 440, 450 and 460 may discharge a charge due to a negative electrical stress to the ground voltage line 304, when the negative electrical stress is applied to a VDD pad 306.

When a positive electrical stress is applied to the VDD pad 306, charges flowing into the VDD pad 306 may be charged in the capacitor C, and a voltage level of the first node N1 may become a logic high level. A voltage level of the first node N1 may be a clamping signal. The NMOS transistors 410, 420, 430 and 460 may be turned on in response to the clamping signal. Therefore, charges due to the positive electrical stress may be discharged through channels of the NMOS transistors 410, 420, 430 and 460, and an internal core circuit may be securely protected.

The NMOS transistors 440 and 450 may not be turned on because the gates 130d and 130e of the NMOS transistors 440 and 450 may be connected to the ground voltage line 304. On-time of each of the NMOS transistors 410, 420 and 430 may be proportional to the resistances of the resistors R3, R2 and R5, respectively, because the resistances of the resistors R3, R2 and R5 may be different from one another. In example embodiments, a quantity of the charges discharged through the channel of the NMOS transistor 410 may be may be substantially the greatest because the relationship of the resistance of the resistors R1, R2, R3 and R5 corresponds to R3>R2=R5>R1. The on-time of the NMOS transistor 410 may be sufficient for discharging charges due to EOS whose duration may be long, when the resistance of the resistor R3 is relatively great. For example, the ESD protection circuit 300 may disperse a current due to ESD or EOS to transistors located on an edge of the clamp device 400 when an ESD or EOS event occurs.

Therefore, an ESD protection circuit of example embodiments may efficiently protect an internal core circuit by sufficiently discharging charges due to EOS stress without an additional resistor, and the ESD protection circuit may prevent or reduce a degradation of a center portion in a transistor with EOS protection. As described above, a transistor with EOS protection and an ESD protection circuit including the same may include a conduction pattern implemented with gates that are connected with respect to each other in a meandering shape. Therefore, the transistor with EOS protection and the ESD protection circuit including the same may increase an on-time of a clamp device and may sufficiently discharge charges due to EOS without increasing circuit size.

Having thus described example embodiments, it is to be understood that example embodiments defined by the appended claims are not to be limited by particular details set forth in the above description as many apparent variations thereof may be possible without departing from the spirit or scope thereof as hereinafter claimed.

What is claimed is:

1. A transistor with electrical overstress (EOS) protection, the transistor comprising:
    an active region in a substrate;
    a plurality of impurity regions in the active region, the impurity regions being arranged at a given distance with respect to each other; and
    a conduction pattern arranged between each of the impurity regions in a meandering shape, the conduction pattern including a center portion and end portions,
    wherein the center portion is directly connected to a ground terminal and at least one of the end portions is directly connected to a capacitor terminal, and
    wherein a resistance of the conduction pattern corresponds to a minimum value at the center portion, and the resistance of the conduction pattern increases according to a distance from the center portion to the end portions of the conduction pattern.

2. The transistor of claim 1, wherein the active region includes a first conduction type and each of the impurity regions includes a second conduction type opposite to the first conduction type.

3. The transistor of claim 2, wherein the first conduction type corresponds to a P type.

4. The transistor of claim 1, further comprising:
    a silicide blocking layer on the conduction pattern.

5. The transistor of claim 1, wherein the transistor corresponds to a large bipolar insulated-gate field-effect transistor (BIGFET).

6. A clamp device comprising the transistor of claim 1.

7. An electrostatic discharge (ESD) protection circuit comprising:
    a stress detection circuit providing a clamping signal at a first node, the clamping signal being activated when a positive ESD event or a positive electrical overstress (EOS) event occurs, the stress detection circuit being connected between a power voltage line and the first node; and
    a clamp device maintaining the activation of the clamping signal until first electric charges due to the positive ESD event or the positive EOS event is discharged, the clamp device being connected between the power voltage line and a ground voltage line,
    wherein the clamp device contains a transistor including,
        an active region in a substrate,
        a plurality of impurity regions in the active region, the impurity regions being arranged at a given distance with respect to each other, and
        a conduction pattern arranged between the impurity regions in a meandering shape, the conduction pattern including a center portion and two end portions,
        wherein the center portion is directly connected to a ground terminal and at least one end portion of the two end portions is directly connected to the first node, and
        wherein a resistance of the conduction pattern corresponds to a minimum value at the center portion, and the resistance of the conduction pattern increases according to a distance from the center portion to the two end portions of the conduction pattern.

8. The ESD protection circuit of claim 7, wherein the clamp device discharges second electric charges due to a negative ESD event or a negative EOS event to the ground voltage line when the negative ESD event or the negative EOS event occurs.

9. The ESD protection circuit of claim 7, wherein the stress detection circuit includes a capacitor having a first terminal connected to the power voltage line and a second terminal connected to the first node.

10. The ESD protection circuit of claim 7, wherein the active region includes a first conduction type and each of the impurity regions includes a second conduction type opposite to the first conduction type.

11. The ESD protection circuit of claim 10, wherein the first conduction type corresponds to a P type.

12. The ESD protection circuit of claim 11, wherein the impurity regions include source regions and drain regions arranged alternatively with respect to each other.

13. The ESD protection circuit of claim 12, wherein each of the source regions is connected to the ground voltage line, and each of the drain regions is connected to the power voltage line.

14. The ESD protection circuit of claim 7, wherein the two end portions of the conduction pattern are connected to the first node.

15. The ESD protection circuit of claim 7, further comprising:
a silicide blocking layer on the conduction pattern.

16. The ESD protection circuit of claim 7, the transistor corresponds to a large (BIGFET).

* * * * *